United States Patent [19]
Nodine

[11] Patent Number: 5,379,145
[45] Date of Patent: Jan. 3, 1995

[54] LASER TRANSMITTER FOR LIGHT WAVE (FIBER OPTIC) COMMUNICATION ESPECTIALLY OF AM MODULATED CATV SIGNALS HAVING MEANS ... AGAINST DAMAGE

[75] Inventor: John P. Nodine, Atlanta, Ga.

[73] Assignee: Scientific-Atlanta, Inc., Atlanta, Ga.

[21] Appl. No.: 138,377

[22] Filed: Oct. 19, 1993

Related U.S. Application Data

[63] Continuation of Ser. No. 935,658, Aug. 26, 1992, abandoned, which is a continuation of Ser. No. 444,486, Dec. 1, 1989, abandoned.

[51] Int. Cl.$^6$ .................................. H02H 5/04
[52] U.S. Cl. .................... 359/187; 361/103; 372/33
[58] Field of Search ............... 455/609, 613, 618, 110; 250/205, 214 C, 238; 361/103, 91, 92; 340/584; 372/29, 33, 34, 109; 606/10–12; 359/187

[56] References Cited

U.S. PATENT DOCUMENTS

| | | | |
|---|---|---|---|
| 4,237,427 | 12/1980 | Holland | 372/29 |
| 4,369,525 | 1/1983 | Breton | 455/618 |
| 4,399,566 | 8/1983 | Roullet | 455/613 |
| 4,476,512 | 10/1984 | Sunago et al. | 361/103 |
| 4,553,268 | 11/1985 | Tilly | 455/607 |
| 4,612,671 | 9/1986 | Giles | 455/609 |
| 4,631,728 | 12/1986 | Simons | 372/29 |
| 4,698,817 | 10/1987 | Burley | 372/33 |
| 4,733,398 | 3/1988 | Shibagaki | 372/31 |
| 4,737,798 | 4/1988 | Lonis et al. | 372/19 |
| 4,789,987 | 12/1988 | Fraser | 372/31 |
| 4,796,996 | 1/1989 | Burns | 356/372 |
| 4,806,873 | 2/1989 | Nagano | 330/4.3 |
| 4,837,787 | 6/1989 | Takesue et al. | 372/29 |
| 4,924,473 | 5/1990 | Burgyan | 372/38 |
| 4,950,268 | 8/1990 | Rink | 372/33 |
| 5,046,138 | 9/1991 | Grubb, III | 359/188 |
| 5,140,603 | 8/1992 | Anderson, Jr. et al. | 372/38 |

FOREIGN PATENT DOCUMENTS

| | | | |
|---|---|---|---|
| 0067702 | 12/1982 | European Pat. Off. | 606/12 |
| 3333248 | 3/1985 | Germany . | |
| 59-4346 | 1/1984 | Japan | 455/600 |
| 60-96040 | 5/1985 | Japan . | |
| 62-0116029 | 5/1987 | Japan | 455/600 |
| 62-245826 | 10/1987 | Japan . | |

*Primary Examiner*—Reinhard Eisenzopf
*Assistant Examiner*—Jill Jackson
*Attorney, Agent, or Firm*—Banner, Birch, McKie & Beckett

[57] ABSTRACT

A laser transmitter utilizes a laser diode which is biased to its stimulated (laser) emission mode of operation by the application of current from a source of one or more operating voltages. The failure of any of these voltages and over temperature conditions of the laser are detected by an optical AND gate which switches the operating voltage off when any one of them is absent. The temperature of the laser is also detected and applied to one of the optos in the chain of the AND gate such that an over temperature condition also results in the switching off of the operating voltage and shut down of the laser. The temperature detection is by way of a circuit having hysteresis such that the optical AND gate is not enabled until the temperature the laser decreases below the initial cut off temperature. Operating current for biasing the laser for laser emission is applied gradually over a period from one to five seconds by connecting the switched operating voltage source to the laser through a slow start circuit. The laser operating current and also the level of the modulating signal (an RF modulating signal carrying a plurality of CATV channels) is applied to the laser through a switching circuit which cuts off the modulating signal when either the current to the laser or the modulating signal level is below predetermined limits.

12 Claims, 3 Drawing Sheets

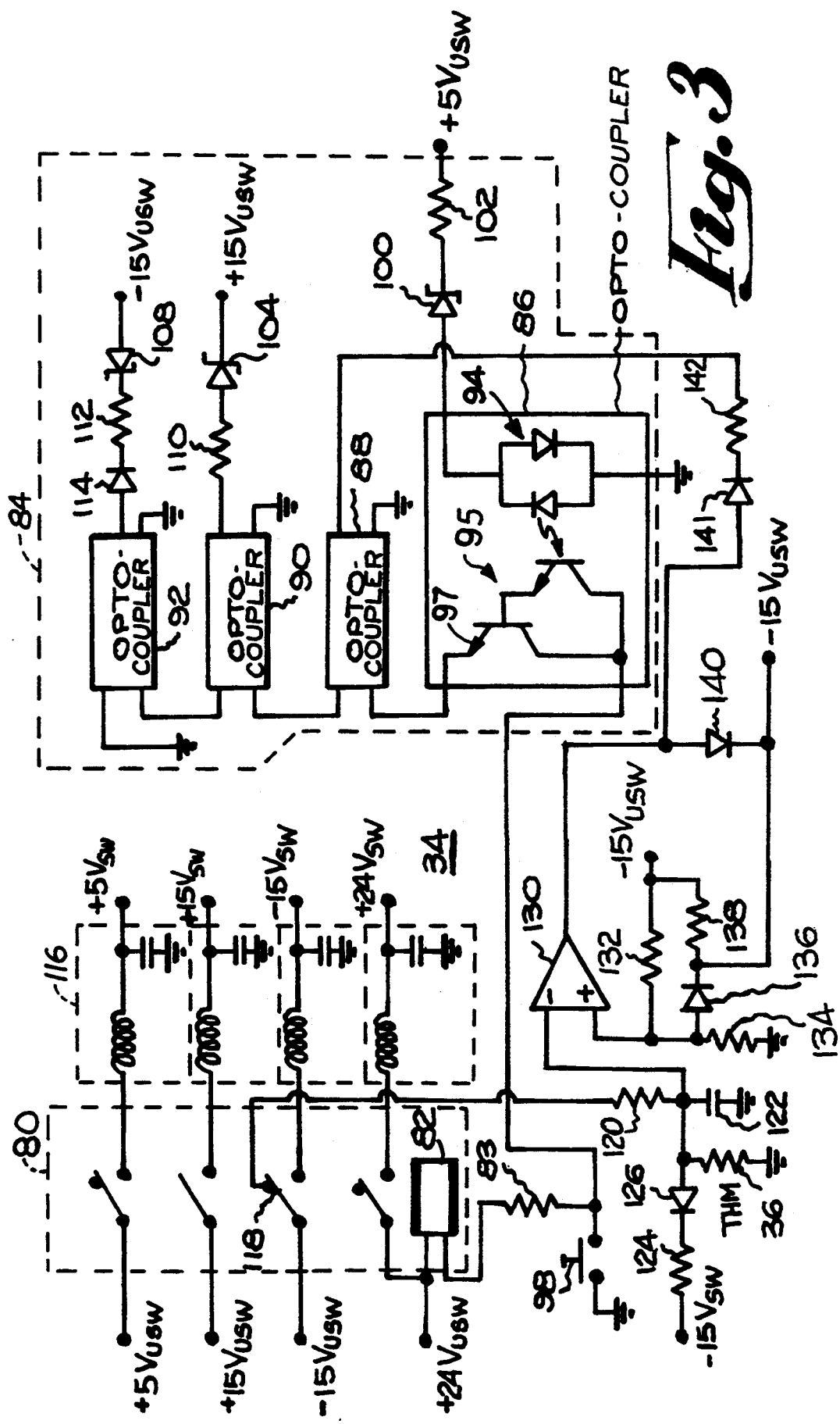

LASER TRANSMITTER FOR LIGHT WAVE (FIBER OPTIC) COMMUNICATION ESPECIALLY OF AM MODULATED CATV SIGNALS HAVING MEANS ... AGAINST DAMAGE

This application is a continuation of application Ser. No. 07/935,658, filed Aug. 26, 1992, which is a continuation of Ser. No. 07/444,486, filed Dec. 1, 1989 both now abandoned.

DESCRIPTION

The present invention relates to optical and particularly laser transmitters for light wave communications and more particularly to a laser transmitter having means for protecting the laser against conditions which can cause damage thereto.

The invention is especially suitable for use in a laser diode transmitter which provides AM modulated optical signals for communication over a fiber optic CATV distribution network. The invention may also be applicable for optical transmitters which provide light waves modulated in accordance with types of modulation other than amplitude modulation (AM) wherever the laser transmitter requires protection against potentially damaging conditions such as the failure of operating voltages, temperatures above specified operating range (over-temperature), failure of laser operating current or modulating signal.

Light wave communication requires the use optical transmitters which convert electrical signals into optical signals which carry the intelligence to be communicated. Laser diodes which are coupled to fiber optic networks are especially suitable for use in optical transmitters. Laser diode devices are, however, sensitive to operating conditions such as temperature, modulating signal level, and the loss or improper application of current which biases the laser diode to its stimulated or laser emission state. It has been suggested to use automatic level control circuits which shut down the laser when the laser power exceeds a certain level. In fact, photo diodes are often built into the laser module to sense such conditions. The use of photo diodes has been found to be insufficient to prevent damage to the laser because the conditions which cause the failure modes are not anticipated or detected before they become catastrophic conditions.

It has been discovered in accordance with the invention that all of the operating voltages of the laser should be sensed and if any one of these voltages fail, the laser should be shut down. Simultaneously, over-temperature conditions should be sensed and added to the conditions which result in shut down. In addition, the application of current to bias the laser into its laser emission mode must be controlled and sensed in order to preclude the rapid application of current or the application of modulation to the laser before the bias current reaches the requisite value for laser emission.

Accordingly, it is the principal object of this invention to provide improved optical transmitters, especially optical transmitters including laser diodes, which are protected against failure due to operating conditions which may precipitate a failure mode in the laser.

It is a further object of the invention to provide an improved optical transmitter which is especially adapted for providing AM CATV optical signals to a fiber optic distribution network and which is protected to prevent failure of the laser diode.

It is a still further object of the present invention to provide an improved optical transmitter in which conditions which can cause failure, such as the absence of any operating voltage or over-temperature conditions which predict such failure modes are detected and are used to shut down the laser diode before damage can occur.

Briefly described, an optical transmitter for light wave communications in accordance with the invention utilizes a laser diode which is biased by current from at least one source of operating voltage which is passed therethrough so that it produces stimulated (laser) emission of coherent light. Circuitry is provided for applying a modulating signal to the laser diode to modulate the light rays emitted therefrom. Protection circuitry is provided by the invention including circuitry for detecting conditions which make damage to the laser diode likely. The protection circuitry also includes circuitry responsive to the presence of any of such conditions for preventing the passage of the operating current through the laser diode and tile application of the modulating signal thereto. The occurrence of any of such condition is facilitated by providing, in such detecting circuitry, an optical AND gate made up of a plurality of opto-couplers having photo emitters and photo detectors, such as photo-transistors. Collector to emitter paths are connected in series to provide an optical AND function. The occurrence of any of the conditions results in cut off of light from the photo emitter of at least one of the opto-couplers thereby inhibiting the AND gate and disconnecting operating voltage from the laser diode.

The foregoing and other objects, features and advantages of the invention as well as a presently preferred embodiment thereof will become more apparent from a reading of the following description in connection with the accompanying drawings in which:

FIG. 3 is a schematic diagram of the power and over-temperature controller of the system shown in FIG. 1.

Figure 1:
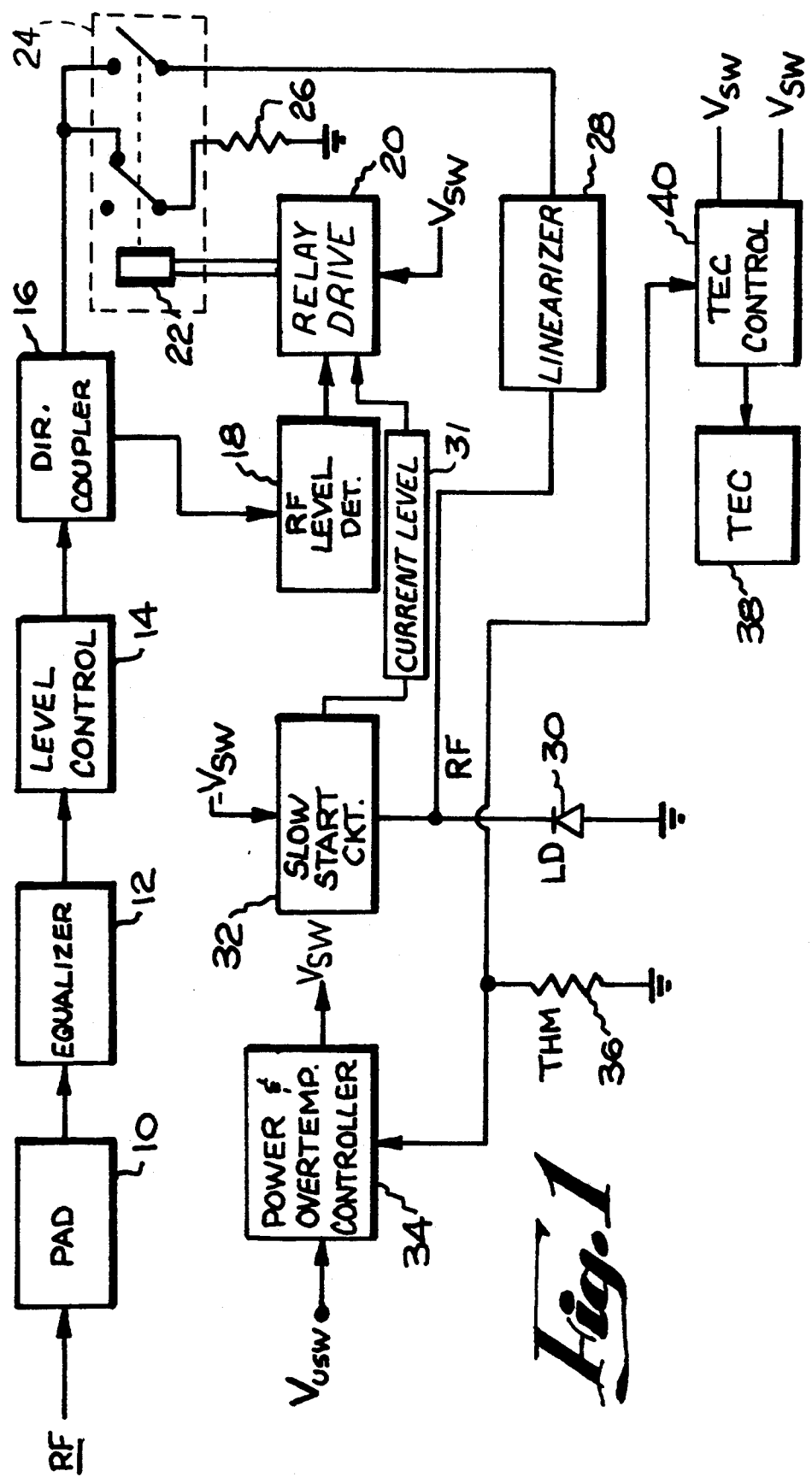
FIG. 1 is a block diagram of a laser transmitter which provides AM optical signals in response to RF CATV modulating signals; and which is adapted to be part of the equipment in the head end of a CATV distribution system having a fiber optic distribution network, the optical fiber(s) and the distribution network not being shown in FIG. 1.

Referring to FIG. 1, an RF modulating signal, which may be a broadband CATV signal including several television signal channels, is connected to a resistive pad 10, which may also have a trimming capacitor connected across it to match the impedance of the modulating signal source. The RF signal is then passed through an equalizer 12, which is a filter designed to maintain an equal or uniform frequency response across the spectrum of modulating signal.

A level control 14, which may be a "T" network having PIN diodes in series and shunt branches to which control levels are applied, controls the level of the modulating signal. The RF modulating signal then passes through a directional coupler 16 which extracts some of the signal and applies it to an RF level detector 18. This level detector 18, which may be a peak detector, drives a relay drive circuit 20. The relay drive circuit 20 passes current through an operating winding 22 of a double pole (dual contact) relay 24. In the deenergized or dropped out condition of the relay 24, the RF modulating signal is applied across a terminating resistor 26. When the relay 24 pulls in, the RF modulating signal is applied through a linearizer network 28 to the laser diode (LD) 30. The linearizer 28 has a response which varies with modulating RF signal amplitude to compensate for the nonlinear response of the laser diode 30. The current to bias the laser diode in its stimulated emission (laser or coherent) light emitting condition, which may be approximately 30 ma, is derived from an operating voltage source indicated at $V_{sw}$. Other operating voltages in the system are indicated as $V_{sw}$. or $V_{usw}$. The nomenclature denotes whether a particular operating voltage is switched ($V_{sw}$) or unswitched ($V_{usw}$). The switching provides a connection between an unswitched operating voltage and the corresponding switched operating voltage.

A switched operating voltage ($V_{sw}$) is used to provide a bias current for the laser diode 24 through a slow start circuit 32. When the voltage is applied, due to the slow start circuit the laser bias current builds up gradually to operating level, thereby avoiding any conditions of shock which may cause catastrophic failure of the laser diode. This circuit 32 will be described in detail in connection with FIG. 2. The relay drive circuit 20 also receives a switched operating voltage. The switched operating voltage is switched off (the $V_{sw}$ voltages is absent) when any absence of an unswitched operating voltage or an over-temperature condition is sensed.

The detection of the absence of an operating voltage or an over-temperature condition takes place in a power and over-temperature controller 34. The inputs to this controller are the voltage across a thermistor (THM) 36 and the unswitched voltages from a power supply (not shown) of the laser transmitter. The controller 34 will be described in greater detail in connection with FIG. 3.

The thermistor 36 is in a thermally coupled relationship with the laser diode 30, and may be part of the module including the laser diode. Also, in a thermally coupled relationship with the laser diode 30 is thermoelectric cooler (TEC) 38, which may be a Peltier junction device. This device is connected to a thermo-electric controller 40 responsive to the voltage developed across the thermistor 36 to turn current to the TEC on and off so to cool the laser diode 30 when its temperature exceeds a certain temperature. The controller 40 is operated by switched operating voltages $V_{sw}$.

Figure 2:
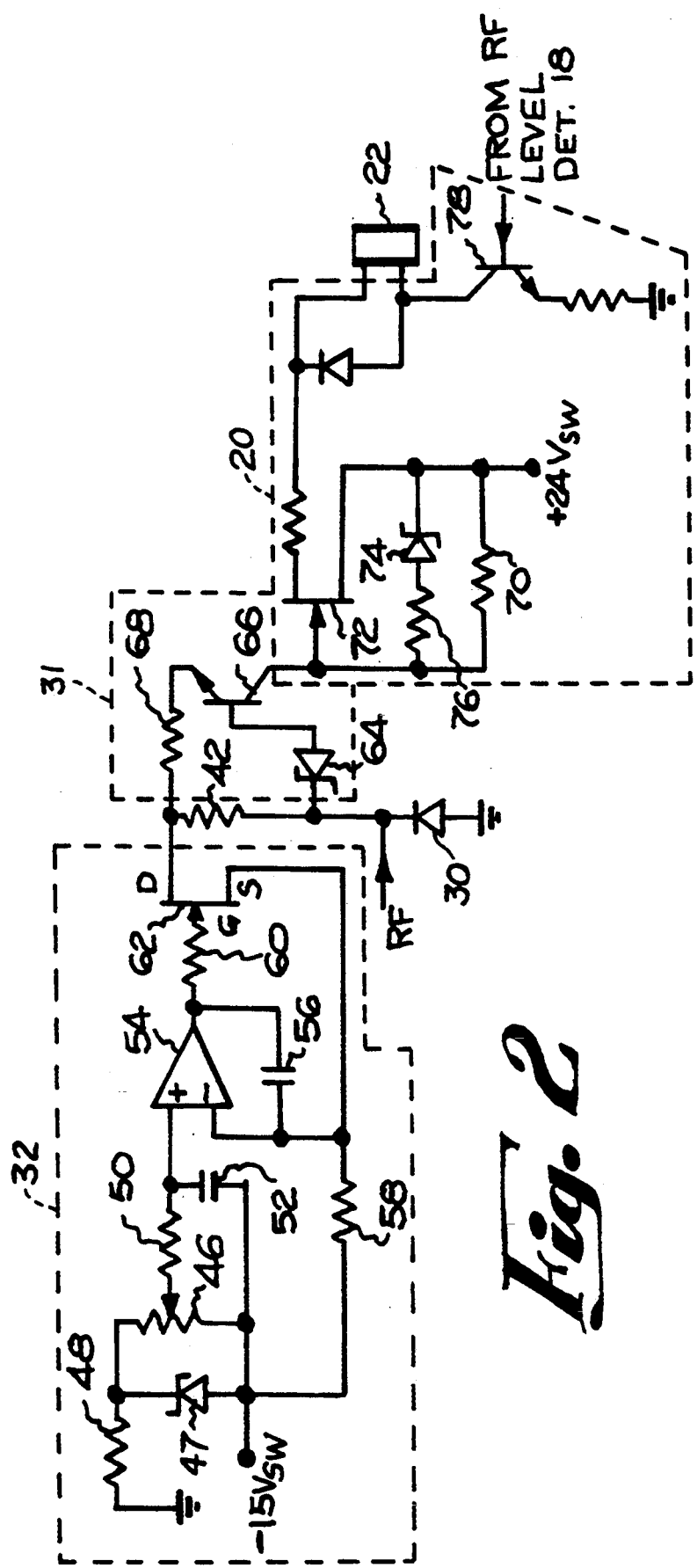
FIG. 2 is a schematic diagram of the slow start and relay driver (RD) circuit of the system shown in FIG. 1.

Referring to FIG. 2, the laser diode 30 is shown connected in series with a resistor 42. Current through the resistor 42 is produced in response to voltage from one of a plurality of switched operating voltages, which in this embodiment the voltage is at $-15$ volts DC ($-15V_{sw}$). This voltage is applied across a voltage divider consisting of a potentiometer 46 and a resistor 48 to ground. A Zener diode 47 limits the voltage across the potentiometer 46. The potentiometer is connected to a charging circuit consisting of a resistor 50 and a capacitor 52. The voltage across the capacitor 52 is applied to the noninverting input of an operational amplifier 54, and provides a reference voltage for slow starting gradually increasing the current) the laser diode 30.

The amplifier 54 is preferably a high impedance amplifier such as includes FET circuits (type CA 3120 is suitable). A feedback capacitor 56 is provided between the output and inverting input of the amplifier 54 for stability. A control voltage from $-15V_{sw}$ operating voltage is applied through a resistor 58 to the inverting input of the amplifier 54.

The output voltage of the amplifier 54 increases gradually as the capacitor 52 charges. This occurs when voltage is applied to the system (on start up or restart). The output of the amplifier 54 is applied, as a control voltage, via a current limiting resistor 60 to the gate of all FET 62. The FET 62, the operational amplifier 54 and the components connected thereto provide a constant current source which supplies current to the laser diode 32. The operating voltage from $-15V_{sw}$ is controlled by the FET 62 and builds up gradually over a period in the range of one to five seconds. After one to five seconds, the operating current may be at the proper level to bias the laser diode into laser emission. The preferred level is 30 ma, but can range from 10 to 150 ma depending upon the type of the laser diode 30.

The operating current is sensed across the resistor 42 and applied via a diode Zener 64 to the base of a transistor 66. The emitter of the transistor 66 is connected through a resistor 68 so that the base to emitter path is across the sensing resistor 42. When the voltage across the resistor 42 corresponds to the operating current, conduction through the diode 64 and base emitter junction of transistor 66 is permitted and the transistor 66 conducts. Conduction is from an operating voltage source, $+24V_{sw}$, through a resistor 70 which sets the bias on all FET 72. A protective circuit consisting of Zener diode 74 and resistor 76 is connected across the gate to source junction of the FET 72. The FET acts as a switch, and when the operating current to the laser diode 30 reaches the requisite level, the FET conducts and allows current to pass through the operating winding 22 of the relay 24 (FIG. 1). The path of conduction through the operating winding 22 is also through the collector to emitter path of a transistor 78. The transistor 78 is a switching transistor which is turned on when the RF level from the RF level detector 18 obtains a peak RF level sufficient for the modulating signal to provide effective modulation of the laser diode 30. Thus, both the modulating signal and operating current of sufficient must be present and of a sufficient level before the relay 24 pulls in and applies the modulating signal through the linearizer 28 to the laser diode 30.

The unswitched operating voltages in this embodiment which are produced by a power supply (not shown) are $+5$, $+15$, $-15$ and $+24$ volts. The power supply outputs for these voltages are indicated at the terminals on the left side of FIG. 3. These voltages are switched by the contacts of a four pole relay 80 having an operating winding 80. The relay 80 is shown in its deenergized condition. The relay 80 pulls in when the current due to the $+24V_{usw}$ operating voltage is enabled to conduct current through an optical AND gate 84. The AND gate 84 is provided by four opto-couplers 86, 88, 90, and 92. All of the opto-couplers are identical in construction one, and only the opto-coupler 86, is shown schematically in detail. The opto-coupler 86 includes a photo emitter 94 consisting of oppositely polarized laser diodes and a photo detector 95 consisting of a photo transistor connected in a Darlington configuration to an output transistor 97. The collector to emitter paths of the output transistors of all the opto-couplers 86, 88, 90 and 92 are connected in series thereby completing the current path to ground from $+24V_{usw}$. The serial path comprises the relay operating winding 82, a resistor 83, and the collector to emitter paths of the transistors 97 in the photo detector parts of the opto-couplers 86, 88, 90 and 92. A manual start may be provided by means of a start button 98 which bypasses the optical AND gate 84.

The opto-coupler 86 has its photo emitter 94 connected through a Zener diode 100 and a resistor 102 to the $+5V_{usw}$ operating voltage. When the voltage exceeds approximately 4V, due to the drops in the resistor 102 the Zener diode 100 and the photo emitter LEDs 94, current passes through the LEDs and light is emitted. The detection of this light by the photo detectors 95 of the opto-coupler 86 causes conduction and the establishment of the current path therethrough. Similarly Zener diodes 104 and 108, and resistors 110 and 112 are used to effect optical emission in the opto-couplers 92 and 90 respectively, when the $-15V_{usw}$ and $+15V_{usw}$ operating voltages are present and of sufficient magnitude for safe operation of the laser diode 30. The $+24V_{usw}$ operating voltage is also automatically sensed since it must be present in order for conduction to occur through the relay operating winding 82.

The contacts of the relay 80 are connected through filters 116 to the respective switched voltage outputs, $+5V_{sw}$, $+15V_{sw}$, $-15V_{sw}$ and $+24V_{sw}$. These LC filters prevent RF modulating signals from propagating through the circuitry of the laser transmitter and into the power supply.

It will be seen that the loss of any of the voltages causes the AND gate 84 to be inhibited and the switched voltage outputs $V_{sw}$ to be cut off. The cut off of these voltages cuts off the laser diode 30 and also the thermoelectric cooler 40. (See FIG. 1).

Over temperature conditions are also detected by the thermistor 36. In the event there is an over temperature condition the opto-coupler 88 is not conductive and the voltages for operating the system are cut off. The thermistor is connected to $-15V_{usw}$ through an alternate contact 118 of the relay 80. During tile time that the voltage ($-15V_{sw}$) is switched off to continue to provide the operating voltage across the thermistor 36, a charging circuit consisting of a resistor 120 and a capacitor 122 is used to maintain the $-15V$ on the inverting input of a comparator 130. It will be appreciated that the voltage across the thermistor 36 continues from $-15V_{sw}$ through a resistor 124 and a diode 126 after switching occurs. The thermistor voltage in this example is $-1.9V$ at 60° C. which is the temperature above which operation of the laser diode is unsafe. The voltage across the thermistor 36 at room temperature, 25° C., is $-7.5V$, while at 40° C. the voltage is $-4.5V$. The condition of exceeding or dropping below the operational temperature 1.9V is sensed by the comparator 130. The comparator is provided with a reference voltage to its noninverting input from $-15V_{usw}$ through a voltage divider provided by a resistor 132 which is connected to $-15V_{usw}$ and another resistor 134 which is connected to ground. A shunt path across the resistor 132 is provided through a diode 136 and another resistor 138.

The output of the comparator 130 is connected through a diode 140 to the junction between the diode 136 and the resistor 138. This junction is also connected to $-15V_{usw}$. When the voltage across the thermistor 36 remains less than 1.9V (temperature less than 60° C.), the output of the comparator 130 is positive, which reverse biases the diode 136 and keeps the shunt path out of the voltage divider. In this state, the opto-coupler 88 is active and the optical AND gate is enabled. If the voltage across the thermistor 36 increases above $-1.9V$ (temperature exceeds 60° C.)the output of the amplifier 130 goes negative. This reverse biases an output diode 141 which is connected through a resistor 142 to the photo emitter of the opto-coupler 88. The opto-coupler 88 then becomes nonconductive and the switched voltages are all cut off. The negative voltage forward biases the diode 136 and increases the voltage on the noninverting input of the comparator 130. Therefore, the temperature must drop to at least 40° C. (a voltage of $-4.5V$) before the output of the comparator 130 again becomes positive and allows the opto-coupler 88 to become conductive. Accordingly, tile temperature detecting circuit has hysteresis which insures safe operation of the laser transmitter.

From the foregoing description it will be apparent that there has been provided an improved optical transmitter having means for protecting the laser diode thereof. Variations and modifications of the described system, within the scope of the invention, will undoubtedly suggest themselves to those skilled in the art. Accordingly, the foregoing description should be taken as illustrative and not in a limiting sense.

I claim:

1. An optical transmitter for light wave communications which comprises:

a laser diode;

means for deriving current from a source of operating voltage and applying said current through said laser diode at a sufficient magnitude to produce stimulated emission of coherent light from said laser diode;

means for applying a modulated signal to said laser diode to modulate the light emitted therefrom;

protection means for said laser diode including means for detecting current or voltage biasing conditions which make damage to said laser diode likely before applying to said laser diode current or voltage having said current or voltage biasing conditions; and means, responsive to the detection of any said current or voltage biasing conditions by said detection means, for preventing the passage of current through said laser diode and the application of said modulating signal thereto such that said laser diode is not subjected to said current or voltage biasing conditions.

2. The optical transmitter according to claim 1 wherein:

one of said current or voltage biasing conditions is the failure of said operating voltage.

3. The optical transmitter according to claim 1 wherein:

said means for deriving current and passing current through said laser diode comprises means, responsive to the application of said operating voltage, for gradually increasing said current to a bias level sufficient to cause laser emission from said laser diode such that said bias level is not reached for at least about one second.

4. The optical transmitter according to claim 1 further comprising:

means responsive to the current which passes through said laser diode for inhibiting the application of said modulating signal to said laser diode until said current reaches about said bias level.

5. An optical transmitter for light wave communications which comprises:

a laser diode;

means for deriving current from a source of operating voltage and for passing said current through said laser diode at a sufficient magnitude to produce stimulated emission of coherent light from said laser diode;

means for applying a modulating signal to said laser diode to modulate the light emitted therefrom;

protection means for said laser diode including means for detecting conditions which make damage to said laser diode likely, said detecting means comprising a plurality of opto-couplers, each having a photo-emitter and a photo-detector in an optically coupled relationship, each said photo-detector including means for providing a current path upon illumination by light from its said photo-emitter, said current path of each photo-detector being connected in series with the other current paths to define an optical AND gate, means for operating each of said opto-couplers separately in response to the detection of a different one of said conditions to inhibit said AND gate; and means, responsive to the detection of any of said conditions by said detection means and the inhibiting of said AND gate, for preventing the passage of said current through said laser diode and the application of said modulating signal thereto.

6. The optical transmitter according tip claim 5 wherein:

one of said conditions is the failure of said source of operating voltage and another of said conditions is when said laser diode exceeds a certain temperature; and wherein said detecting means include means connected to the photo-emitter of one of said opto-couplers for causing light emission therefrom when the laser diode temperature is below said certain temperature and preventing light emission therefrom when the laser diode temperature is above said certain temperature.

7. (Once Amended) The optical transmitter according to claim 6 wherein said means for causing and preventing light emission when the laser diode temperature is below and above said certain temperature further comprises:

hysteresis means for preventing light emission from said photo-emitter after said light emission has been terminated upon the laser diode temperature exceeding said certain temperature until the laser diode temperature drops to a predetermined temperature below said certain temperature.

8. The optical transmitter according to claim 5 wherein said means for preventing the passage of said current through said laser diode comprises:

a relay having an operating element and means for switching a connection of said source of operating voltage to said current deriving means on and off; and wherein said operating element is connected in series with said current paths of said opto-couplers.

9. The optical transmitter according to claim 8 wherein:

said source of operating voltage provides a plurality of operating voltages, said relay having a plurality of switching means, each for switching the connection different one of said plurality of operating voltages on and off.

10. The optical transmitter according to claim 9 wherein:

said conditions are the failure of any of said plurality of operating voltages, and said detecting means comprises means for applying different ones of said operating voltages separately to said photo-emitters of different ones of said opto-couplers when the operating voltages exceed certain voltage levels.

11. The optical transmitter according to claim 9 further comprising:

temperature controller means operated by at least one of said operating voltages which is applied thereto through one of said connections switched by said switching means and having means for cooling said laser diode; and said temperature controller controlling said means for cooling in response to the temperature of said laser diode.

12. An optical transmitter for light wave communications which comprises:

a laser diode;

means for deriving current from a source of operating voltage and for passing said current through said laser diode at a sufficient magnitude to produce stimulated emission of coherent light from said laser diode;

means for applying a modulating signal to said laser diode to modulate the light emitted therefrom;

protection means for said laser diode including means for detecting conditions which make damage to said laser diode likely;

means, responsive to the detection of any of said conditions by said detection means, for preventing the passage of said current through said laser diode and the application of said modulating signal thereto;

means responsive to the application of said operating voltage for gradually increasing said current to a bias level sufficient to cause laser emission from said laser diode such that said bias level is not reached for at least about one second;

means, responsive to the current which passes through said laser diode, for inhibiting the application of said modulating signal to said laser diode until said current reaches about said bias level; and means, responsive to the level of said modulating signal, for inhibiting the application of said modulating signal until the level thereof is a predetermined level.

* * * * *